United States Patent
Johnson

(10) Patent No.: US 9,988,720 B2
(45) Date of Patent: Jun. 5, 2018

(54) CHARGE TRANSFER ROLLER FOR USE IN AN ADDITIVE DEPOSITION SYSTEM AND PROCESS

(71) Applicant: PALO ALTO RESEARCH CENTER INCORPORATED, Palo Alto, CA (US)

(72) Inventor: David Mathew Johnson, San Francisco, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 0 days. days.

(21) Appl. No.: 15/292,906

(22) Filed: Oct. 13, 2016

(65) Prior Publication Data

US 2018/0105937 A1 Apr. 19, 2018

(51) Int. Cl.
 *G03G 15/18* (2006.01)
 *C23C 16/50* (2006.01)

(52) U.S. Cl.
 CPC .............. *C23C 16/50* (2013.01); *G03G 15/18* (2013.01)

(58) Field of Classification Search
 None
 See application file for complete search history.

(56) References Cited

U.S. PATENT DOCUMENTS

| | | |
|---|---|---|
| 2,291,046 A | 7/1942 | Lange |
| 3,554,815 A | 1/1971 | Otto |
| 3,626,833 A | 12/1971 | Koch |
| 3,649,829 A | 3/1972 | Randolph |
| 3,702,258 A | 11/1972 | Gibbons et al. |
| 3,717,875 A | 2/1973 | Arciprete et al. |
| 3,873,025 A | 3/1975 | Qvarnstrom |
| 3,926,114 A | 12/1975 | Matuschke |
| 4,034,670 A | 7/1977 | Zavodny |
| 4,222,059 A | 9/1980 | Crean et al. |
| 4,384,296 A | 5/1983 | Torpey |
| 5,003,327 A * | 3/1991 | Theodoulou ......... G03G 15/321 347/112 |
| 5,270,086 A | 12/1993 | Hamlin |
| 5,307,119 A * | 4/1994 | Folkins .............. G03G 15/1605 399/46 |

(Continued)

FOREIGN PATENT DOCUMENTS

EP 2227834 8/2011

OTHER PUBLICATIONS

Sholin, V. et al.: "High Work Function Materials for Source/Drain Contacts in Printed Polymer Thin Transistors," Applied Physics Letters, vol. 92, 2008.

(Continued)

*Primary Examiner* — Jethro M Pence
(74) *Attorney, Agent, or Firm* — Marger Johnson

(57) ABSTRACT

An electrostatic charge based additive deposition system that includes a charge transfer roller and a charging device. The charging device configured to selectively charge a portion of the charge transfer roller. A substrate portion is selectively charged based on contact with the selectively charged portion of the charge transfer roller. The selectively charged substrate portion then undergoing an additive deposition process in which electrostatically charged additive material is deposited onto the substrate based on the selective electrostatic charging of the substrate.

7 Claims, 6 Drawing Sheets

(56) References Cited

U.S. PATENT DOCUMENTS

| | | | |
|---|---|---|---|
| 5,314,119 A | 5/1994 | Watt | |
| 5,402,214 A * | 3/1995 | Henderson | G03G 15/0855 118/689 |
| 6,382,524 B1 | 5/2002 | James | |
| 6,576,861 B2 | 6/2003 | Sampath et al. | |
| 6,622,335 B1 | 9/2003 | Anderson et al. | |
| 6,934,142 B2 | 8/2005 | Grosse et al. | |
| 7,083,830 B2 | 8/2006 | Minko | |
| 8,132,744 B2 | 3/2012 | King et al. | |
| 8,272,579 B2 | 9/2012 | King et al. | |
| 8,511,251 B2 | 8/2013 | Sato | |
| 8,552,299 B2 | 10/2013 | Rogers et al. | |
| 8,720,370 B2 | 5/2014 | Rebstock | |
| 8,742,246 B2 | 6/2014 | Toyoda et al. | |
| 9,021,948 B2 | 5/2015 | Pattekar | |
| 2002/0053320 A1 | 5/2002 | Duthaler et al. | |
| 2005/0000231 A1 | 1/2005 | Lee | |
| 2006/0035033 A1 | 2/2006 | Tanahashi et al. | |
| 2009/0014046 A1 | 1/2009 | Yu et al. | |
| 2010/0154856 A1 | 6/2010 | Yuichi et al. | |
| 2011/0017431 A1 | 1/2011 | Yang et al. | |
| 2011/0150036 A1 | 6/2011 | Lee et al. | |
| 2011/0154558 A1 | 6/2011 | Peter et al. | |
| 2012/0227778 A1 | 9/2012 | Leonov | |
| 2013/0087180 A1 | 4/2013 | Stark et al. | |
| 2014/0146116 A1 | 5/2014 | Paschkewitz | |

OTHER PUBLICATIONS

Zhou, Li, et al: "Highly Conductive, Flexible, Polyurethane-Based Adhesives for Flexible and Printed Electronics," Advanced Functional Materials, vol. 23, p. 1459-1465, wileyonlinelibrary.com.

McClure, Max, "Stanford Researchers' Cooling Glove Better than Steroids—and Helps Solve Physiological Mystery Too", Stanford Report, Aug. 29, 2012, 3 pages, retrieved from the Internet: http://news.stanford.edu/news/2012/august/cooling-glove-research-082912.html, retrieved on Dec. 19, 2014.

Matheson, Rob, "Cool Invention Wins First Place at MADMEC", MIT News Office, Oct. 17, 2013, 3 pages, retrieved from the Internet: http://newsoffice.mit.edu/2013/madmec-design-competition-1017, retrieved on Dec. 19, 2014.

Vanhemert, Kyle, "MIT Wristband Could Make AC Obsolete", Wired.com, Oct. 30, 2013, retrieved from the Internet: http://www.wired.com/2013/10/an-ingenious-wristband-that-keeps-your-body-at-theperfect-temperature-no-ac-required/, retrieved on Dec. 19, 2014.

Francioso, L., "Flexible thermoelectric generator for ambient assisted living wearable biometric sensors", Journal of Power Sources, vol. 196, Issue 6, Mar. 15, 2011, pp. 3239-3243.

http://www.stacoolvest.com/, retrieved on Dec. 19, 2014.
http://www.steelevest.com/, retrieved on Dec. 19, 2014.
http://www.veskimo.com/, retrieved on Dec. 19, 2014.
http://www.glaciertek.com/, retrieved on Dec. 19, 2014.
http://www.cvs.com/shop/product-detail/CVS-Cold-Pain-Relief-Pack-Reusable?skuld=324111, retrieved on Dec. 19, 2014.

Chen, A.,"Dispenser-printed planar thick-film thermoelectric energy generators," J. Micromech. Microeng., 21(10), 2011.

Hewitt, A.B., "Multilayered Carbon Nanotube/Polymer Composite Based Thermoelectric Fabrics," Nano Letters, 12(3), pp. 1307-1310, 2012.

Arens, E., "Partial- and whole-body thermal sensation and comfort—Part I: Uniform environmental conditions," Journal of Thermal Biology, vol. 31, Issues 1-2, Jan. 2006, pp. 53-59.

Arens, E., "Partial- and whole-body thermal sensation and comfort—Part II: Non-uniform environmental conditions," Journal of Thermal Biology, vol. 31, Issues 1-2, Jan. 2006, pp. 60-66.

Bullis, Kevin, "Expandable Silicon", MIT Technology Review, Dec. 14, 2007, URL: http://www.technologyreview.com/news/409198/expandable-silicon/, retrieved from the Internet on Dec. 23, 2014.

"Ortho-Planar Spring", BYI Mechanical Engineering Website, URL: http://compliantmechanisms.byu.edu/content/ortho-planar-spring, retrieved from the Internet on Dec. 23, 2014.

S.-J. Kim, J.-H. Wea and B.-J. Cho: "A wearable thermoelectric generator fabricated on a glass fabric," Energy Environmental Science, 2014.

L. Francioso, C. De Pascali, A. Taurino, P. Siciliano, A. De Risi: "Wearable and flexible thermoelectric generator with enhanced package," In Proc. SPIE 8763, Smart Sensors, Actuators, and MEMS VI, 876306, May 2013.

C. Huizenga, H. Zhang, E. Arens, D. Wang: "Skin and core temperature response to partial- and whole-body heating and cooling," Journal of Thermal Biology, vol. 29, Issues 7-8, Oct.-Dec. 2004, pp. 549-558.

Bhat, Pradeep R, "Formation of beads-on-a-string structures during break-up of viscoelastic filaments," Aug. 2010, vol. 6:625-631, Nature Physics, 7 pages.

Le, Hue P., "Progress and Trends in Ink-jet Printing Technology," Jan./Feb. 1998, vol. 42:49-62, Journal of Imaging Science and Technology, 16 pages, found at: http://www.imaging.org/ist/resources/tutorials/inkjet.cfm.

Oliveira, Monica S., "Iterated Stretching, Extensional Rheology and Formation of Beads-on-a-String Structures in Polymer Solutions," Jan. 20, 2006, Special Issue of JNNFM on Extensional Flow, MIT, Cambridge, MA, 36 pages.

Owen, M., "Misting of non-Newtonian Liquids in Forward Roll Coating," Jul. 13, 2011, Journal of Non-Newtonian Fluid Mechanics, vol. 166:1123-1128, 6 pages.

Shi, X.D., "A Cascade of Structure in a Drop Falling from a Faucet," Jul. 8, 2004, vol. 265:219-222, Science, 4 pages.

Chapter 15, "Ink Jet Printing", 14 pages, found at http://www.lintech.org/comp-per/15INK.pdf.

Marple, A. and Liu, Y.H.: "Characteristics of Laminar Jet Impactors", Environmental Science & Technology, vol. 8, No. 7, Jul. 1974, pp. 648-654.

Bailey, Adrian G.: "The Science and technology of electrostatic powder spraying, transport and coating", Journal of Electrostatics, vol. 45, 1998, pp. 85-120.

Domnick, et al.: "The Simulation of Electrostatic Spray Painting Process with High-Speed Rotary Bell Atomizers. Part II: External Charging", Part. Part. Syst. Charact. vol. 23, 2006, pp. 408-416, URL: http://www.ppsc-journal.com.

Kelly, Ryan T, et al..: "The ion funnel: theory, implementations, and applications", Mass Spectrometry Reviews,vol. 29, 2010, pp. 294-312.

Crowe, Clayton et al.: "Multiphase Flows With Droplets and Particles", CRC Press, LLC, 1998.

* cited by examiner

US 9,988,720 B2

CHARGE TRANSFER ROLLER FOR USE IN AN ADDITIVE DEPOSITION SYSTEM AND PROCESS

TECHNICAL FIELD

The presently disclosed embodiments are directed to a charge transfer roller for use in an electrostatic charge based additive deposition process.

BACKGROUND

Custom manufacturing of parts is a growing industry and has wide ranging applications. Traditionally, injection molding machines and other machining techniques were used to create models of objects or to create the objects themselves. More specifically, heated materials like glass, metals, thermoplastics, and other polymers are injected into an injection mold specifically formed in the shape of the desired object. The material is allowed to cool in the mold and take on the shape of the mold to form the object. Injection molds are expensive and time-consuming to create and changes to the shape of the object are difficult to accommodate without further increasing the time and expense of creating the object.

The additive manufacturing industry arose in response to the expense, time, and difficulty in changing injection molds to create models or objects themselves. Known additive manufacturing techniques include fused deposition modeling (FDM), stereolithography (SLA), selective laser sintering (SLS), and jetting systems among others. Each known additive manufacturing technique has limitations in materials, expense, and/or volume capabilities that prevent the production of small run, customized manufacturing and prototyping using a complete set of thermoplastic materials. Further, known additive manufacturing techniques are unable to accurately create a part with mechanical properties, surface finish, and feature replication of the quality object produced by traditional techniques like injection molding.

In situations in which additive manufacturing does not produce parts of sufficient performance for an application, an entire industry of rapid computer numerical control (CNC) machining and rapid injection molding using low cost tools has arisen. However, these techniques are significantly more expensive than additive manufacturing techniques and have their own process limitations.

The industry was forced to decide between a high quality, high volume capability object produced by the traditional, but expensive, inflexible, and time-consuming techniques like injection molding and additive manufacturing techniques that produced a lower quality object, perhaps without the desired structural integrity, and sometimes without the desired materials, but with greater speed and flexibility. For example, FDM and SLS are limited in the type of material able to be used and create a less than 100% density object. Rapid CNC molding has better quality objects with great feature detail and finishes, but remains expensive. Prototypes created with the known additive manufacturing techniques are often refined until a final design is selected at which point an injection mold is created for large scale, high quality injection molding production. Such a multi-phase production process is also time-consuming and expensive.

The manufacturing industry would benefit from a manufacturing process that realizes the advantages of digital, additive manufacturing with a broad set of thermoplastic materials and feature resolution to be capable of manufacturing objects with the complexity and structural integrity obtained using more traditional manufacturing techniques.

SUMMARY

According to aspects illustrated herein, there is provided a charge transfer roller for use in an additive deposition process. The charge transfer roller configured to be selectively charged by a charging device, the charge transfer roller transferring the selective charging to a substrate for a selective additive deposition process.

DETAILED DESCRIPTION

Embodiments and arrangements disclosed herein include a charge transfer roller for use in an electrostatic charge based additive deposition process. The electrostatic charge based additive deposition process uses electrostatically charged additive material that is deposited onto a substrate that has been selectively charged. The additive material is deposited onto the selectively charged substrate based on the selective electrostatic charging of the substrate. The charge transfer roller can be selectively charged and in-turn apply that selective charging to the substrate to selectively charge the substrate as desired. The use of the charge transfer roller can increase the resolution of the selective charging and reduces charge blooming effects in thick substrates.

Figure 1:
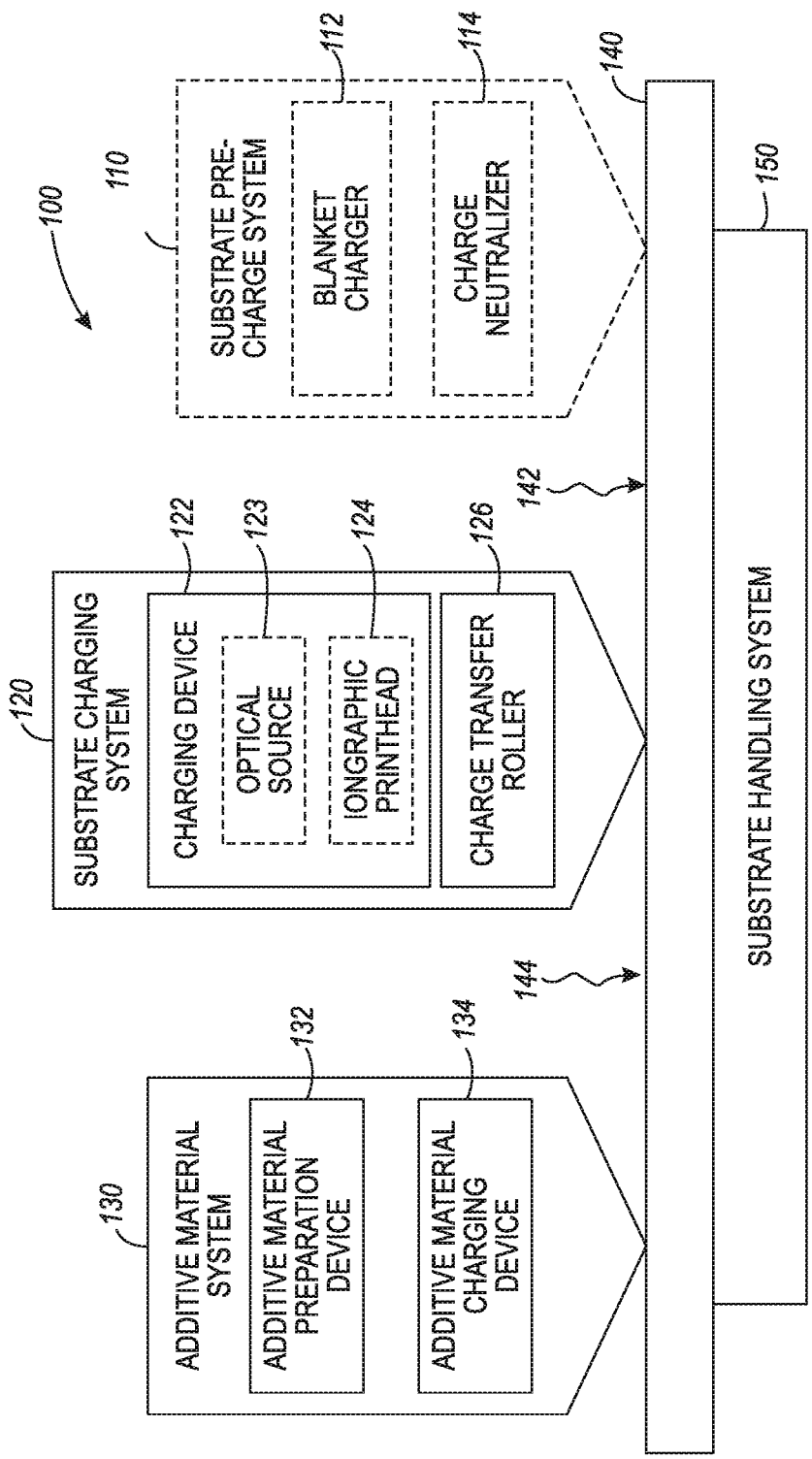
FIG. 1 is an example additive deposition system including a selective charging system having a charge transfer roller.

FIG. 1 is an example additive deposition system 100 that utilizes electrostatic charge based selective deposition. A selective charging system 120 selectively charges the substrate 140 in a desired or preselected pattern. The pattern of charging can be a positive, i.e. additive material is deposited onto the selectively charged areas created by the selective charging system 120, or the pattern of charging can be a negative, i.e. the additive material is repelled from the selectively charged areas created by the selective charging system 120 and deposited in the areas that were not affected or charged by the selective charging system 120.

Selectively charged substrate 144 is then exposed to the additive material for selective deposition. An additive material system 130 prepares and charges additive material for selected deposition onto the selectively charged portions 144 of the substrate 140, a positive additive deposition process. Alternatively, in the case of a negative deposition process, the prepared and charged additive material is deposited in non-selectively charged portions the substrate 140. That is, the additive material is deposited on the substrate 140 about or around the selectively charged portions 144. The process of selectively charging the substrate in a pattern and depositing additive material onto the substrate 140 based on the selective charging can be repeated to build-up a matrix of additive material, layer-by-layer.

The selective charging system 120 includes a charge transfer roller 126 that applies the selective charging to the substrate 140 and a charging device 122 that applies the desired selective charging to the charge transfer roller 126. The charging device 122 selectively charges the charge transfer roller 126 a portion at a time. As the charge transfer roller 126 is rotated, the charging device 122 selectively charges the charge transfer roller 126 one portion at a time. The selectively charged portions of the charge transfer roller 126 contact or come in proximity to the substrate 140, selectively applying or altering the surface charge of the substrate 140 based on the selectively charged portions of the charge transfer roller 126. The selectively charged substrate 144 is then exposed to the additive material for deposition of the additive material onto the selectively charged substrate 144 based on the selective charging imparted onto the substrate 140 by the selectively charged portions of the charge transfer roller 126.

The charging device 122 of the selective charging system 120 can be an ionographic printhead 124. The ionographic printhead generates and modulates a stream of ions towards the charge transfer roller 126 to form a selectively charged portion of the charge transfer roller 126. The ionographic printhead 124 can be translated along the axis of the charge transfer roller 126 during the selective charging process. Alternatively, the ionographic printhead 124 can have a length similar or greater than the length of the charger transfer roller 126, which selectively charges a portion of the charge transfer roller 126 across the length of the charge transfer roller 126.

Alternatively, the charging device 122 can include an optical source 123 that selectively charges a charge transfer roller 126 having an outer covering of electrophotographic material. Light from the optical source 123 strikes the electrophotographic material of the charge transfer roller 126 and induces or modifies a charge locally in the material. Modulating the light emitted from the optical source 123 allows for the selective charging of the charge transfer roller 126. The optical source 123 can span the entire length of the charge transfer roller 126 or can be translated across the length of the charge transfer roller 126 to perform the selective charging. Additive material is deposited onto the substrate 140 based on the selectively charged portions 144 of the substrate 140. The additive material is processed, or handled, by the additive material system 130 in preparation for selective deposition onto the substrate 140. The additive material system 130 includes an additive material preparation device 132 and an additive material charging device 134. The additive material preparation device 132 prepares additive material of a desirable size, such as a droplet or powder form. The additive material preparation device 132 can include an excluder or other means of size selection of the additive material packages to prevent additive material having a size outside of desired parameters from being processed further. Once prepared, the additive material is charged in preparation for deposition onto the substrate 140 based on the selective charged portions 144 of the substrate 140.

In an embodiment, the additive material preparation device 132 can be a filament extension atomizer (FEA). The filament extension atomizer stretches filaments of an additive material in a fluid state. The break-up of the stretched fluid filaments produces droplets of additive material that can then be charged for selective deposition onto the substrate 140.

Once the additive material is prepared to a sufficient or desired size and state by the additive material preparation device 132, the prepared additive material can be charged by the additive material charging device 134. The additive material charging device 134 imparts an electrostatic charge or potential in or on the prepared additive material. The imparted charge can be similar or opposite a charge of the selectively charged portions 144 of the substrate 140. If the charge of the additive material is similar to that of the selectively charged portions 144 of the substrate 140, a negative process of additive deposition occurs in which the additive material is deposited, due to the electrostatic repulsion, onto the substrate 140 in the portions other than the selectively charged portions 144. The negative deposition process is due to the repulsion caused by the similar charges of the additive material and the selectively charged portions 144 of the substrate 140. If the charge of the additive material is opposite that of the selectively charged portions 144, a positive process of additive deposition occurs in which the additive material is deposited, due to electrostatic attraction, onto the selectively charged portions 144 of the substrate 140. The positive deposition process is due to the attraction caused by the oppositely charged additive material and the selectively charged portions 144 of the substrate 140.

A substrate pre-charge system 110 can be included in the additive deposition system 100. The substrate pre-charge system 110 can uniformly charge the substrate 140 to a desired charge, having a polarity and, optionally, a magnitude, using a blanket charger 112. Additionally, the substrate pre-charge system can include a charge neutralizer 114 to neutralize the charge of the substrate 140. The substrate pre-charge system 110 can use the charge neutralizer 114 to effectively "blank" or remove any existing charges from the surface of the substrate 140 and from any previously deposited layers of additive material. The blanket charger 112 can then uniformly the charge the surface of the substrate and any exposed layers of previously deposited additive material. The blanket charger 112 creates a uniform charge across a top, exposed, layer of substrate 140 and previously deposited additive material. The uniformly charged or charge neutral substrate 142 is then selectively charged by the selective charging system 120.

The additive deposition system 100 can include a substrate handling system 150 that translates the substrate beneath the substrate pre-charge system 110, the selective charging system 120 and/or the additive material system 130. For objects formed of multiple layers of selectively deposited additive material, the substrate handling system 150 can translate the substrate 140 in a vertical direction in preparation for the ensuing layers.

Figure 2:
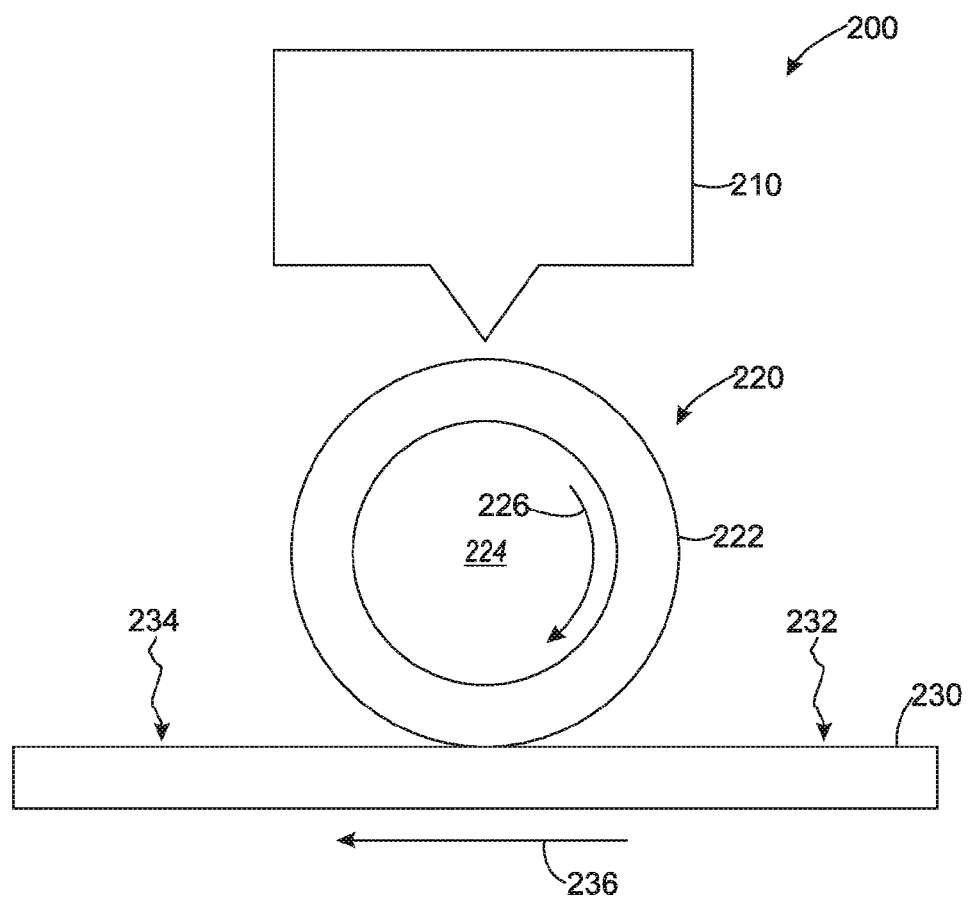
FIG. 2 is an example selective charging system including a charge transfer roller for use in an additive deposition system.

FIG. 2 shows an example selective charging system 200, including an ionographic printhead 210 and a charge transfer roller 220. The ionographic printhead 210 generates a stream of ions and directs them onto the charge transfer roller 220, which selectively charges a portion of the charge transfer roller 220 in a desired or selected pattern. The charge transfer roller 220 then contacts the substrate 230, which causes the substrate to become selectively charged based on the selective charging on the charge transfer roller 220 at the point of contact with the substrate 230.

The ionographic printhead 210 generates and modulates a flow of ions that are directed onto a dielectric layer 222 of the charge transfer roller 220. The modulation of ions from the ionographic printhead 210 onto the dielectric layer 222 of the charge transfer roller 220 selectively charges a portion of the charge transfer roller 220. The ions from the ionographic printhead 210 are accelerated onto the dielectric layer 222 of the charge transfer roller 220 by the ground plane or back electrode 224 about which the dielectric layer 222 is disposed. The ground plane 224 further assists with the retention of charge on the dielectric layer 222.

Ions from the ionographic printhead 210 can induce, modify or neutralize charge in the dielectric layer 222 of the charge transfer roller 220. The selective flow of ions from the ionographic printhead can induce or impart selective electrostatic charging of the dielectric layer 222. Alternatively, the dielectric layer 222 can be uniformly charged prior to the ionographic printhead 210. The selective flow of ions from the ionographic printhead 210 can then selectively modify or neutralize portions of the uniformly charged dialectic layer 222.

The dielectric layer 222 can be relatively thin, which increases the retention of a desired magnitude of charge on the dielectric layer 222 to selectively charge the charge transfer roller 220. The degree of control over the selective placement of charge onto the dielectric layer 222 and the magnitude of the selectively placed charge increases the available resolution for the additive deposition process. The reduction of charge blooming, charge leakage or migration, in the dielectric layer 222, allows a high degree of precision in charge location and magnitude which increases the available resolution for an additive deposition process.

The combination of a relatively thin dielectric layer 222 and control over the ground plane or back electrode 224 allows for a high resolution, selective additive deposition process to be achieved through control over charge placement and magnitude. Controlling the magnitude of the charge to be transferred by the charge transfer roller 220 onto the substrate 230 allows control over the amount of additive material that is deposited in that particular location. In response to the magnitude of a selectively charged portion of the substrate 230, more or less additive material is electrostatically attracted to and agglomerate in that location based on the charge of the additive material.

To transfer selective charging to the substrate 230, the charge transfer roller 220 is rotated 226 while the substrate 230 is translated 236 such that the relative velocity is substantially zero at a point of contact between the charge transfer roller 220 and the substrate 230. At the point of contact, or nip, between the charge transfer roller 220 and the substrate 230, the selective charge of the dielectric layer 222 alters the charging of the substrate 230, which selectively charges or neutralizes a portion of the substrate 230 based on the selective charging imparted onto the charge transfer roller 220 by the ionographic printhead 210. The selectively charged substrate 234 can then be exposed to charged additive material to perform the additive deposition process onto the substrate 230 based on the selectively charged portions 234.

In an example, the substrate 230 can undergo a pre-charging process to pre-charge the substrate 232 before being selectively neutralized by the selective charging system 200. The pre-charging process can include neutralizing the surface charges of the substrate 230 and/or charging the substrate 230 with a uniform charge across the surface. In context, the surface of the substrate 230 and the substrate 230 are understood to be the exposed upper surface of the substrate and/or any previously deposited layers of additive material.

A mechanical system to maintain charge transfer roller 220 contact with the substrate 230 can be included in the selective charging system 200. The charge transfer roller 220 can be weighted, internally or externally, to increase its mass and reduce the likelihood the charge transfer roller 220 loses contact with the surface of the substrate 230. Alternatively, a spring or system of springs can be used to retain the charge transfer roller 220 against the surface of the substrate 230. In a further example, an active system can be used to maintain contact between the charge transfer roller 220 and the surface of the substrate 230. The active system can further adjust the amount of pressure exerted by the charge transfer roller 220 on the surface of the substrate 230, which allows a desired or required contact pressure between the charge transfer roller 220 and substrate 230 to be achieved.

In a further example, rather than an ion based selective charging system, the selective charging system 200 can be a light based system. A laser or other optical source can be used to selectively charge a charge transfer roller having an electrophotographic material about its exterior. In this example, the ionographic printhead is replaced with a light source that can be selectively activated to induce or modify electrostatic charge on the electrophotographic material of the charge transfer roller. The contact of light on the electrophotographic material causes a selective change in the electrostatic charge of the electrophotographic material, which either induces an electrostatic charge or modifies/neutralizes an existing electrostatic charge at the point of light contact. As with the ion based selective charging system, the light based selective charging system can selectively induce or neutralize surface charging of the charge transfer roller, which in turn can selectively charge or neutralize the surface charging of the substrate.

Figure 3:
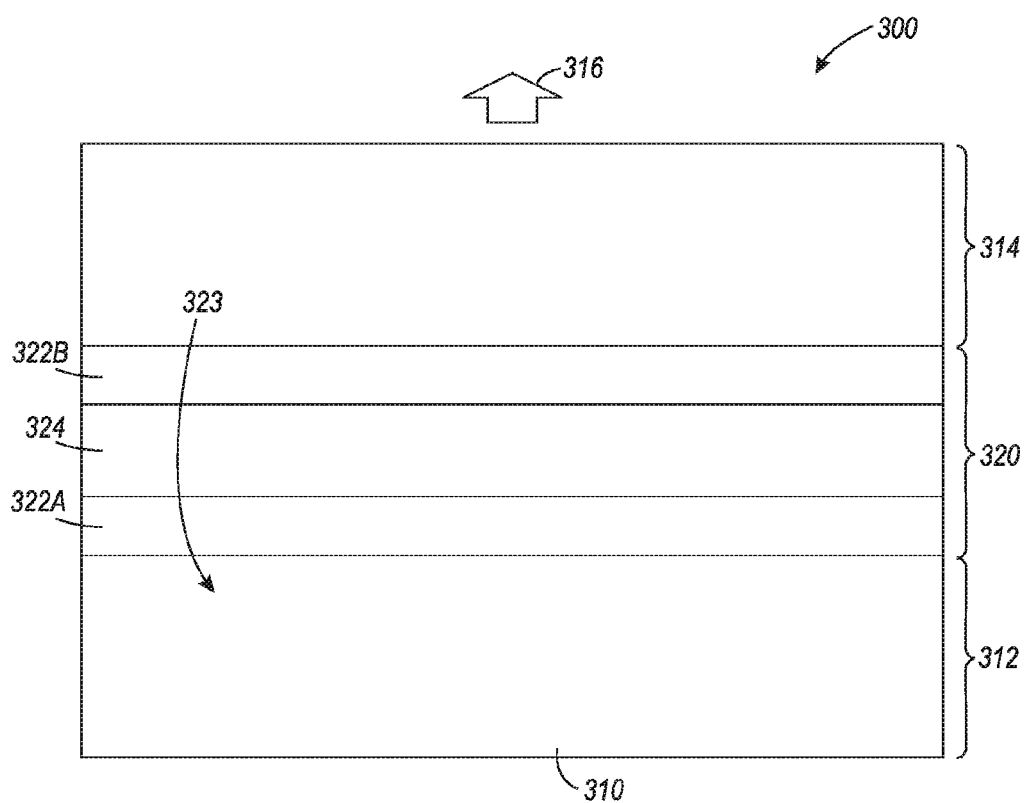
FIG. 3 is a top view of an example selective charging system including a charge transfer roller for use in an additive deposition system.

FIG. 3 is a top view of an example selective charging system 300 that includes a charge transfer roller 320. A substrate 310 is translated 316 beneath a rotating 323 charge transfer roller 320. The charge transfer roller 320 is selectively charged by a charging device 324. The selectively charged portion 314 of the substrate can then be exposed to electrostatically charged additive material to selectively deposit additive material onto the substrate 310 based on the selectively charged portion 314.

The charging device 324 can span the entire length of the charge transfer roller 320, as shown in FIG. 3, or can span a length greater than or less than the length of the charge transfer roller 320. The charge transfer roller 320 can be interchanged from the selective charging system 300 to match the width of the substrate, as necessary or desired.

In the example shown in FIG. 3, the charging device 324 is an ionographic printhead that generates and modulates a stream of ions to selectively charge the charge transfer roller 320. The selectively charged portion 322A of the charge transfer roller 320 is rotated 323 to contact the substrate 310 and selectively charge a portion 314 of the substrate 310. The now neutralized portion 322B of the charge transfer roller 320 is then rotated 323 to be selectively charged 322A again by the ionographic printhead 324. Alternatively, the portion 322B of the roller can be uniformly charged or neutralized prior to selective charging by the ionographic printhead 324.

Additionally, the substrate 310 can be pre-charged 312 to a neutral or uniformly charged state. This can assist in the selective charging process by creating a uniformly charged substrate 310 that can then be charge altered in a more precise and measured manner by minimizing the degree the substrate 310 can affect the magnitude of the applied selective charging. Further, the pre-charging of the substrate can remove or override any residual electrostatic charges that remain in the substrate 310 or previously deposited additive material. Pre-charging can assist in increasing or maintaining the achievable resolution of the selective additive deposition process.

Figure 4A:
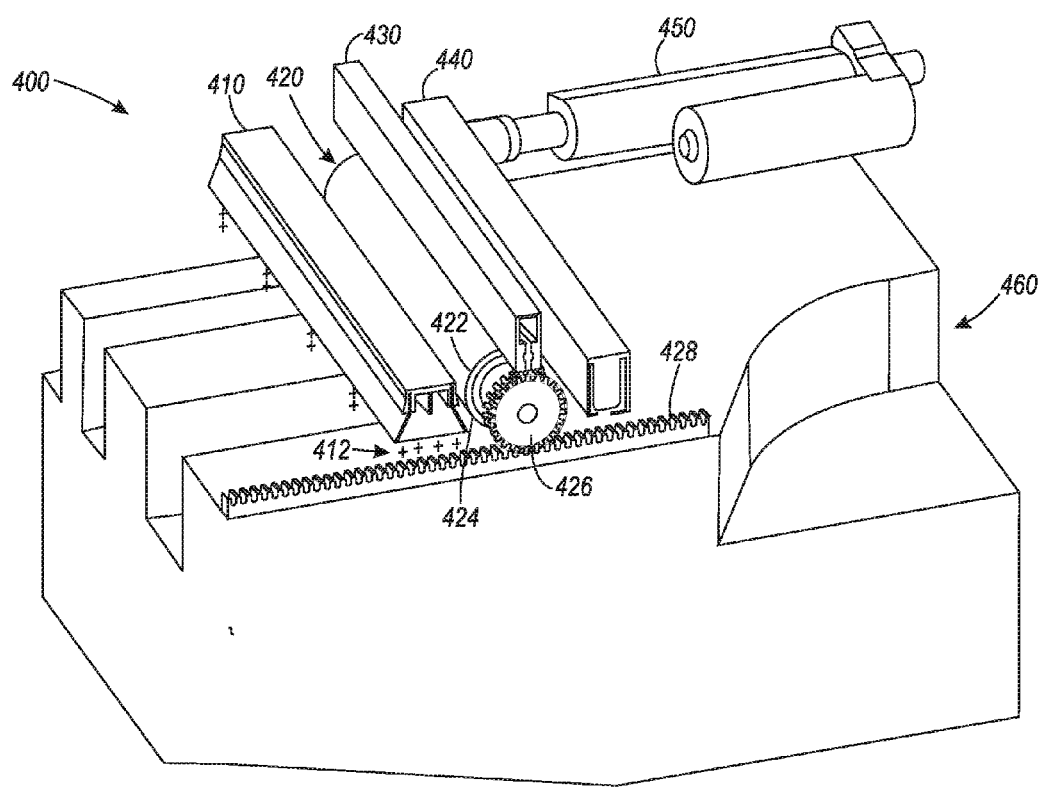
FIGS. 4A-4C are an example additive deposition system including a selective charging system having a charge transfer roller.
Figure 4B:
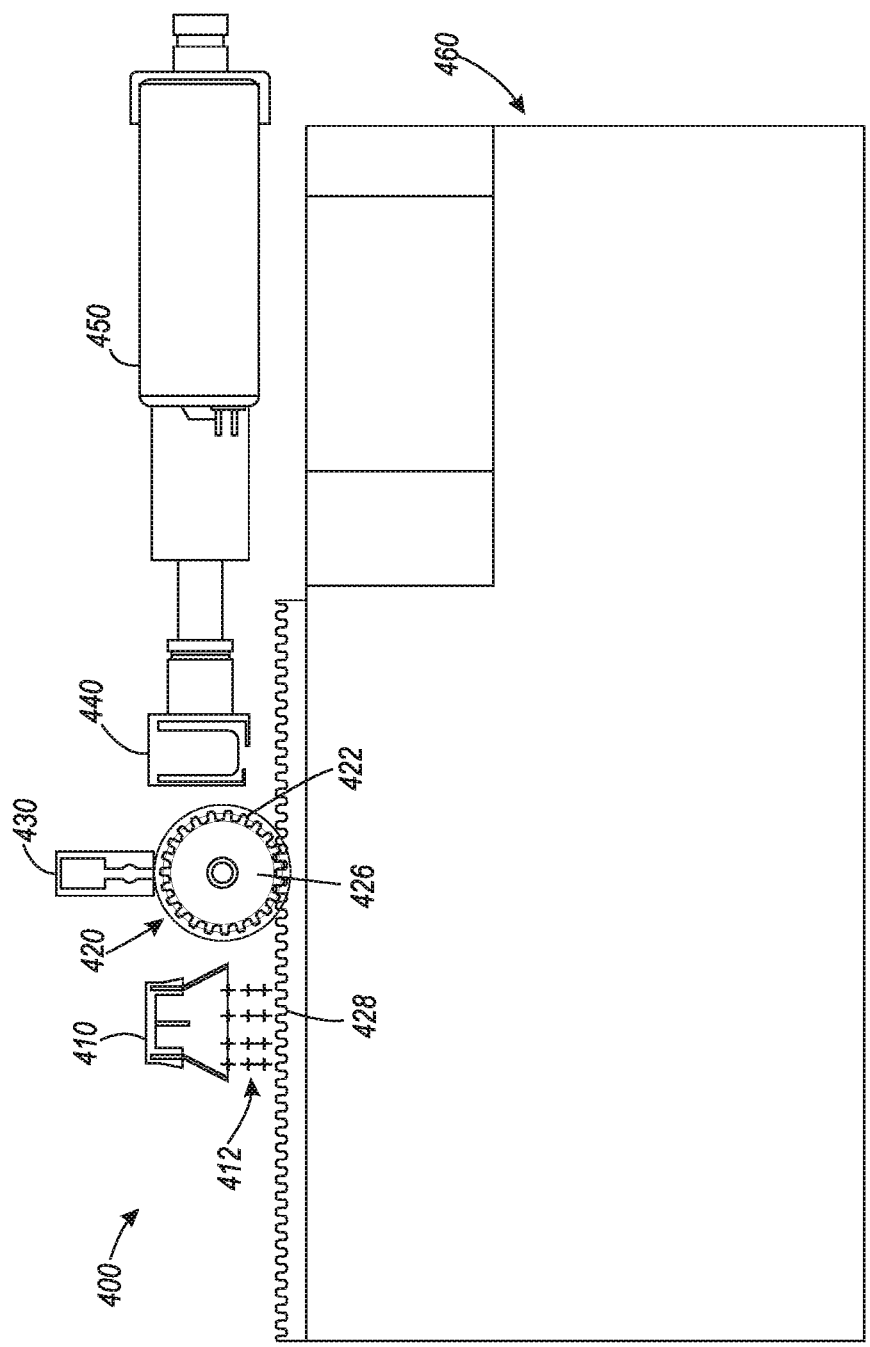
Figure 4C:
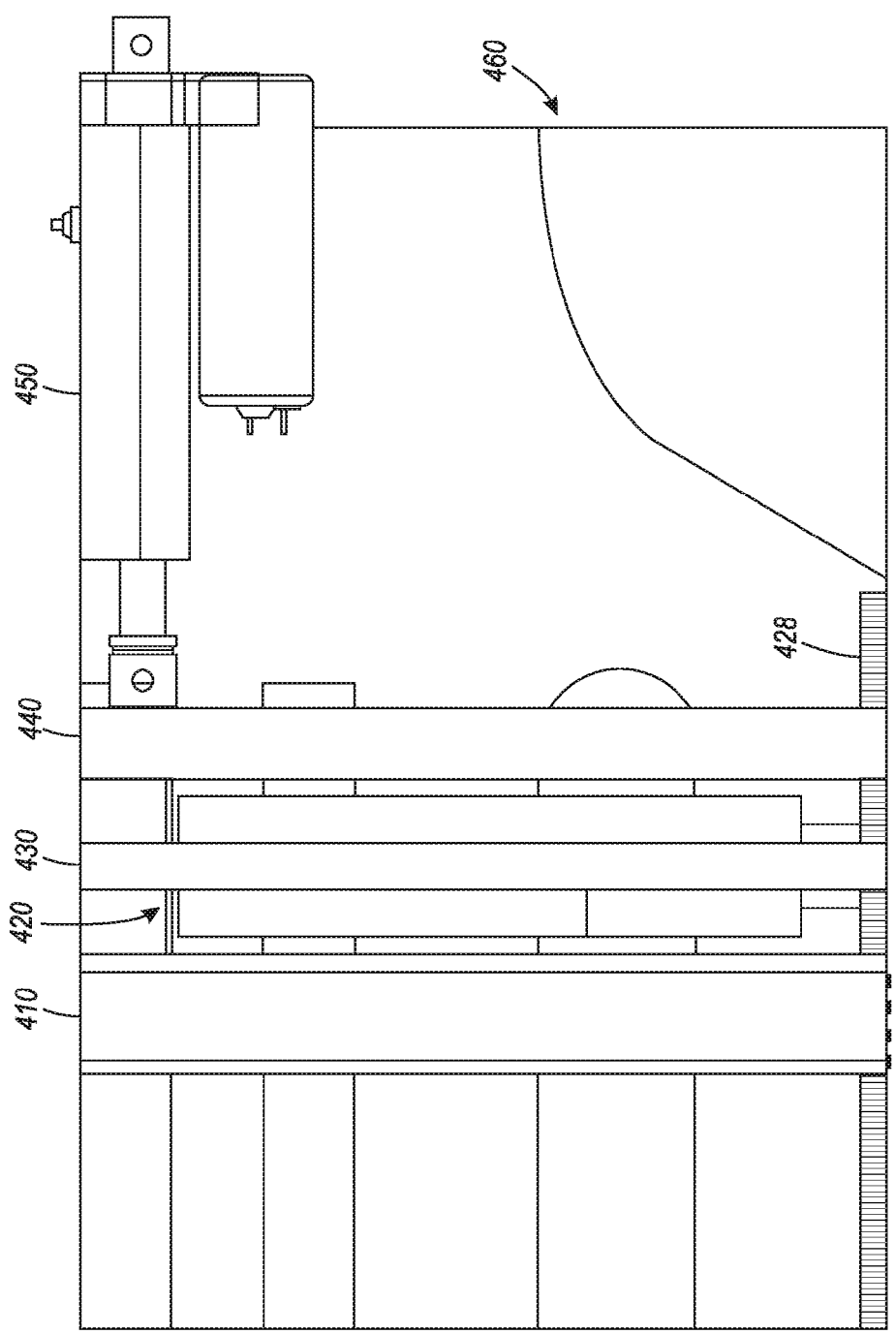

FIGS. 4A-4C are an example additive deposition system 400 including a selective charging system having a charge transfer roller 420. Additive material is selectively deposited onto the substrate 460 through the additive deposition system 400 based on charging of the substrate 460 surface and the charging of the additive material.

A blanket charger, such as a scorotron, 410 uniformly charges the surface of the substrate 460. The scorotron 410 emits ions 412, uniformly charging the surface of the substrate 460 with a charge in preparation for a selective charging process. The charge transfer roller 420 is selectively charged by an ionographic printhead 430. The ionographic print head 430 emits a stream of ions directed towards the charge transfer roller 420 to selectively charge the roller 420 in a desired pattern. The charge transfer roller 420 includes a conductive core 424 surrounded by a layer of dielectric material 422. The conductive core 424 and the layer of dielectric material 422 retain the selective charging created by the ionographic printhead 430 on the surface of the charge transfer roller 420. As the charge transfer roller 420 rotates, the stored charges on the dielectric layer 422 contact the uniformly charged substrate 460 surface, selectively altering the surface charges of the substrate 460 based on the selective charging of the charge transfer roller 420.

Additive material is then deposited onto the selectively charged substrate 460 surface based on the selective charging of the substrate 460 surface and a charge of the additive material. The additive material is passed through an additive material depositor 440 that channels or directs charged additive material proximate the surface of the substrate 460. Additive material can be attracted and deposited onto oppositely charged portions of the surface of the substrate 460. The amount of additive material deposited is based on the charge of the additive material and the charge of the selectively charged portions of the substrate 460, as the additive material can be attracted onto the selectively charged surface of the substrate 460 until the selective charge is substantially neutralized.

The assembly of the scorotron 410, charge transfer roller 420, ionographic printhead 430 and additive material depositor 440 are translated across the substrate 460 surface by a linear actuator 450 that extends and retracts moving the assembly. The charge transfer roller 420 can include a charge transfer roller drive gear 426 that engages a charge transfer roller drive track 428 on the surface of the substrate 460. The engagement of the drive gear 426 and drive track 428 rotates and indexes the charge transfer roller 420 as the linear actuator 450 extends and retracts. As the linear actuator 450 translates the assembly, the linear motion of the assembly causes the rotation of the drive gear 426, rotating the charge transfer roller 420. As the charge transfer roller 420 rotates, the selective charging stored on the dielectric layer 422 selectively alters the uniformly charged surface of the substrate 460.

The drive track 428, the assembly and the linear actuator can be moved vertically as multiple layers of additive material are selectively deposited onto the surface of the substrate 460. As additional layers of material are deposited onto the substrate 460, the additive deposition system 400, linear actuator 450 and the gear track 428 can be raised to maintain a prescribed distance from the surface of the substrate 460. Alternatively, the additive deposition system 400, linear actuator 450 and gear track 428 can be fixed in position and the substrate 460 raised and lowered beneath to maintain an appropriate distance between the additive depositions system 400 and the surface of the substrate 460.

After each layer, the areas of the build platform that are not filled in with deposited material 460 can be filled in with a support material in order to ensure the entire area is filled with a material.

The use of a charge transfer roller allows for a high resolution additive deposition process. The charge transfer roller allows a greater degree of precision in charge placement and charge magnitude, allowing for greater control over the additive deposition process as a whole.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

The invention claimed is:

1. An additive deposition system, including:
a charge transfer roller;
a substrate;
a charging device configured to selectively alter a first charge of a first portion of the charge transfer roller thereby creating a selectively charge altered first portion of the charge transfer roller, the selectively charge altered first portion of the charge transfer roller contacting the substrate thereby selectively altering a first charge of a first portion of the substrate based on the selectively charge altered first portion of the charge transfer roller;
an additive material system to deposit charged material on the substrate in layers after selectively altering the first charge of the first portion of the substrate; and
a drive track, a drive gear to rotate the charge transfer roller, and a linear actuator to extend and retract the charge transfer roller across the substrate and to repeatedly alter a vertical distance between the substrate and the charging device as subsequent layers of the charged material build up on the substrate.

2. The additive deposition system of claim 1, wherein the charging device is an ionographic printhead.

3. The additive deposition system of claim 2, wherein the charge transfer roller includes an outer periphery of dielectric material and a central portion configured to be at least one of a ground plane or back electrode.

4. The additive deposition system of claim 1, wherein the charging device is an optical source.

5. The additive deposition system of claim 4, wherein the charge transfer roller includes an electrophotographic material configured to alter a local charge in response to light emitted from the optical source.

6. The additive deposition system of claim 1, wherein the charge transfer roller includes a retention system configured to maintain minimum contact between the charge transfer roller and the substrate.

7. The additive deposition system of claim 1, wherein the charge transfer roller includes an indexing element positioned at an end of the charge transfer roller, the indexing element configured to rotate and control rotation of the charge transfer roller during translation across the substrate.

* * * * *